(12) United States Patent
Fujiwara et al.

(10) Patent No.: US 6,465,859 B1
(45) Date of Patent: Oct. 15, 2002

(54) CMOS-TYPE SOLID STATE IMAGING DEVICE THAT PREVENTS CHARGE INFLOW INTO OPTICAL BLACK

(75) Inventors: Koji Fujiwara, Kawasaki (JP); Iwao Sugiyama, Kawasaki (JP); Toshitaka Mizuguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/963,410

(22) Filed: Sep. 27, 2001

(30) Foreign Application Priority Data

Apr. 26, 2001 (JP) ........................... 2001-130216

(51) Int. Cl.[7] ................ H01L 31/0232; H01L 31/00
(52) U.S. Cl. ........................ 257/435; 257/431
(58) Field of Search ................... 257/431, 435, 257/443

(56) References Cited

U.S. PATENT DOCUMENTS

| | | | | | |
|---|---|---|---|---|---|
| 3,969,751 A | * | 7/1976 | Drukaroff et al. | ............ | 136/256 |
| 5,045,906 A | * | 9/1991 | Nagaya | .................... | 257/223 |
| 5,619,049 A | * | 4/1997 | Kim | ........................ | 257/223 |
| 5,942,774 A | * | 8/1999 | Isogai et al. | ................ | 257/257 |

FOREIGN PATENT DOCUMENTS

| JP | 56-78179 | 6/1981 |
|---|---|---|
| JP | 2000-196055 | 7/2000 |

\* cited by examiner

*Primary Examiner*—Allan R. Wilson
(74) *Attorney, Agent, or Firm*—Arent Fox Kintner Plotkin & Kahn, PLLC

(57) ABSTRACT

A solid state imaging device includes a semiconductor substrate, a light receiving section which is provided in a surface of the semiconductor substrate, and includes an array of pixels that accumulate electric charge through photoelectric conversion of incoming light, a light shielding section which includes an array of pixels formed in the surface of the semiconductor substrate and shielded from light, and a drain which is situated between the light receiving section and the light shielding section, and is formed to a depth deeper in the semiconductor substrate than the light receiving section and the light shielding section.

8 Claims, 11 Drawing Sheets

- 41 GATE
- 44 VDD
- 42 GATE
- 43 GATE
- 45 OUTPUT
- 40 PHOTO DIODE
- PIXCEL UNIT

LIGHT RECEIVING SECTION

CMOS-TYPE SOLID STATE IMAGING DEVICE THAT PREVENTS CHARGE INFLOW INTO OPTICAL BLACK

BACKGROUND OF THE INVENTION

1. Field of the Invention

The present invention generally relates to CMOS-type solid state imaging devices, and particularly relates to a CMOS-type solid state imaging device which has a stabilized black level that is used to prevent signal level fluctuation caused by temperature changes.

2. Description of the Related Art

Solid state imaging devices are provided with shielded pixels called an optical black, and use signals from these pixels as a reference black level when outputting signals from the light receiving section. This is aimed at preventing the signal levels of the light receiving section from fluctuating in response to temperature variation. If intense light illuminates the vicinity of the optical black in the light receiving section, however, electric charges spilling from the photo diodes flow into the pixels of the optical black section, thereby raising the black level thereof. In this case, the signal levels of the pixels using the boosted black level as a reference level end up being lower than the signal levels of the pixels using a normal black level as a reference level. This significantly degrades the quality of reproduced images.

FIGS. 1A and 1B are cross-sectional views of solid stage imaging devices having a structure that prevents electrical charge from flowing into the optical black section (Japanese Patent Laid-open Application No. 56-78179).

In the first related-art example shown in FIG. 1A, an N-type semiconductor layer 73 serving as a drain is formed in a P-type semiconductor layer 72 provided on an N-type semiconductor substrate 71. The second related-art example shown in FIG. 1B is directed to a case in which a P-type semiconductor substrate 75 is used. In this example, a P-type semiconductor substrate 75 and a P-type semiconductor layer 76 sandwich an N-type semiconductor layer 77 that receives a reverse bias. A drain 78 is formed in the P-type semiconductor layer 76.

The first related-art example and the second related-art example both have a structure that accumulates electrical charge in potential wells formed by electrodes when the electrical charge is generated through photoelectric conversion.

In the related-art configurations, an electric-charge accumulating section and a drain are formed in the same semiconductor layer, thereby preventing seepage of electrical charge from the light receiving section into the optical black with an aim of stabilizing the black level. The first related-art configuration, however, is effective only in a case where an N-type semiconductor substrate is adopted. If this configuration is applied to CMOS-type solid stage imaging devices that generally employ P-type substrates, no effect is observed with respect to electric charge that is generated deep in the substrate. Further, since the drain is separated from the N-type semiconductor substrate, an effect of capturing electric charge is not sufficient.

The second related-art configuration employing a P-type semiconductor substrate is provided with the N-type semiconductor layer having a reverse bias applied thereto. Since the drain is separated from the N-type semiconductor layer, an effect of capturing electric charge is not sufficient.

Accordingly, the present invention is aimed at providing a CMOS-type solid state imaging device that prevents electric charge from flowing into an optical black section, thereby stabilizing a black level.

SUMMARY OF THE INVENTION

It is a general object of the present invention to provide a CMOS-type solid state imaging device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a CMOS-type solid state imaging device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a solid state imaging device, including a semiconductor substrate, a light receiving section which is provided in a surface of the semiconductor substrate, and includes an array of pixels that accumulate electric charge through photoelectric conversion of incoming light, a light shielding section which includes an array of pixels formed in the surface of the semiconductor substrate and shielded from light, and a drain which is situated between the light receiving section and the light shielding section, and is formed to a depth deeper in the semiconductor substrate than the light receiving section and the light shielding section.

In the CMOS-type solid state imaging device according to the present invention described above, the light receiving section and the optical black section are formed separately, and the drain is formed between the light receiving section and the optical black section so as to reach a depth deeper in the substrate than the light receiving section and the optical black section. Through the function of the drain, it is possible to prevent electric charge leaking from the light-receiving section from flowing into the optical black section when intense light illuminates the light-receiving section.

That is, although electric charge generated in a P-type well of the light receiving section is accumulated at photo diodes, electric charge leaks out when the photo diodes are saturated upon illumination by intense light. Even when this happens, the leaked charge will be captured by the drain. Moreover, since an N-type semiconductor layer of the drain is formed deeper into the substrate than the P-type well, electric charge generated at a depth deeper than the P-type well will be captured by the drain without flowing into the optical black section. Such prevention of inflow of electric charge is effective against the electric charge generated in the P-type well as well as against the electric charge generated at a depth deeper than the P-type well, thereby making it possible to obtain a stable black level even when intense light illuminates the light-receiving section.

DESCRIPTION OF THE PREFERRED EMBODIMENTS

In the following, embodiments of the present invention will be described with reference to the accompanying drawings.

Figure 1A:
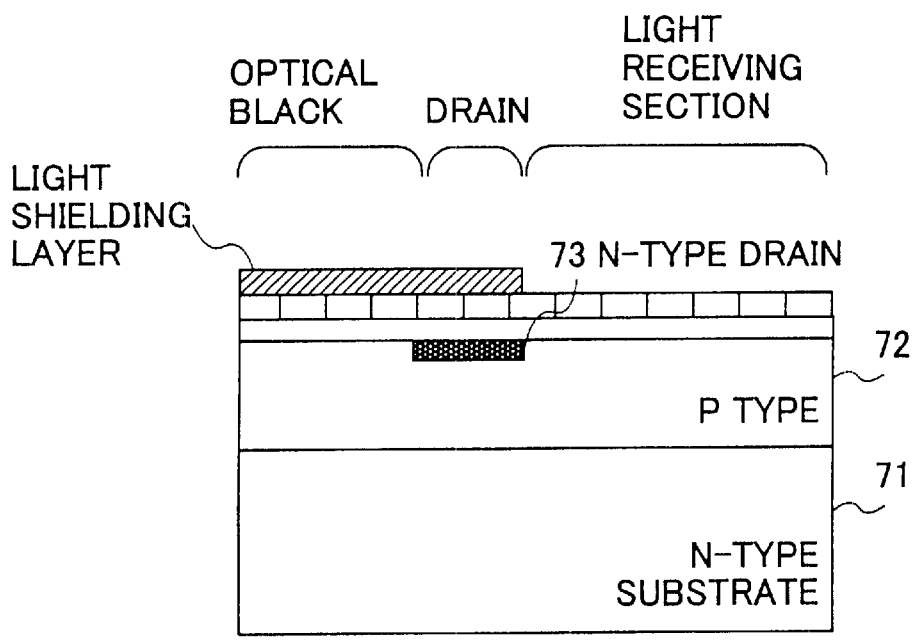
FIGS. 1A and 1B are cross-sectional views of solid stage imaging devices having a structure that prevents electrical charge from flowing into an optical black section.
Figure 1B:
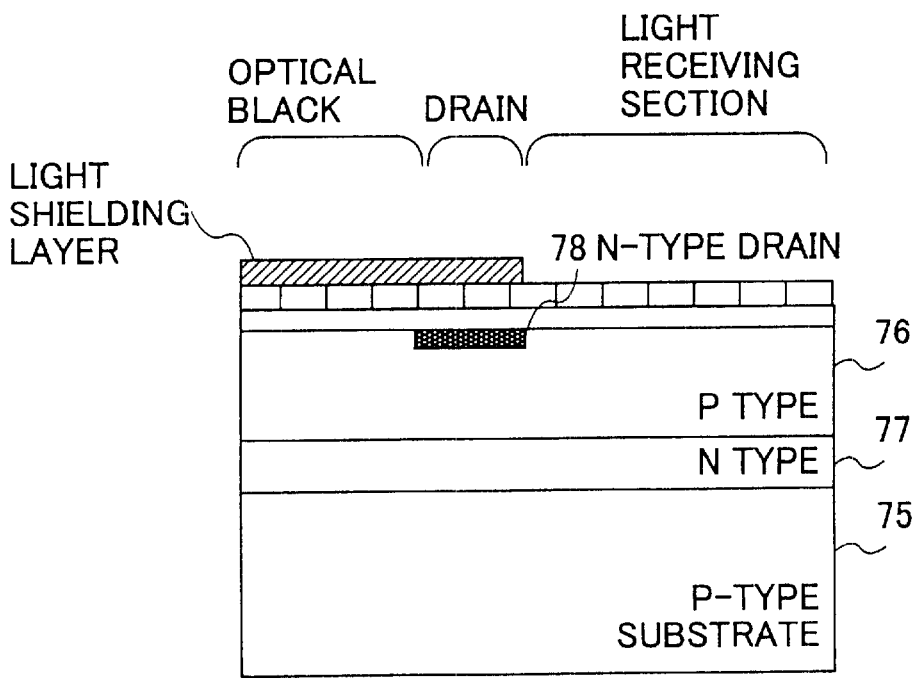
Figure 2:
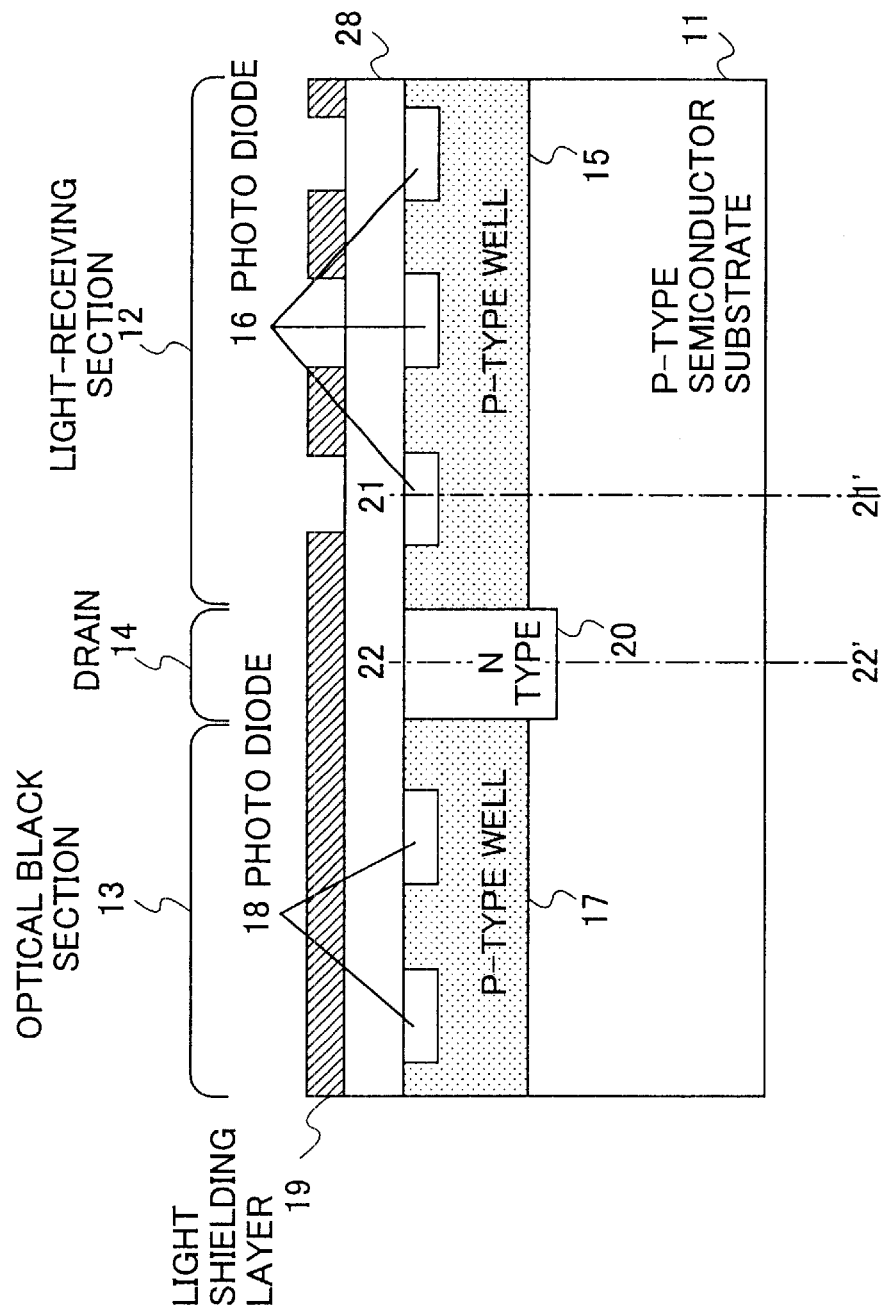
FIG. 2 is a drawing showing a configuration of a first embodiment of a CMOS-type solid state imaging device according to the present invention.

FIG. 2 is a drawing showing a configuration of the first embodiment of a CMOS-type solid state imaging device according to the present invention.

In the CMOS-type solid state imaging device of FIG. 2, a light-receiving section 12, an optical black section 13, and a drain 14 are formed on a P-type semiconductor substrate 11. A numeral designation 28 indicates a surface protection layer.

The light-receiving section 12 includes a P-type well 15 which has the peak of impurity concentration in the core of the substrate, photo diodes 16 made of an N-type semiconductor layer, and a plurality of MOS transistors (now shown). The optical black section 13 has the same structure as the light-receiving section 12, and includes a P-type well 17, photo diodes 18 made of an N-type semiconductor layer, and a plurality of MOS transistors (not shown). In these light-receiving section 12 and the optical black section 13, an $N^+$-type photo diode 16 or 18 and the plurality of N-channel MOS transistors together make up each pixel of the imaging device. The photoelectric conversion of incidence light is performed on a pixel-by-pixel basis, and electric charge generated from the photoelectric conversion is accumulated in a charge accumulation portion.

The only difference between the optical black section 13 and the light-receiving section 12 is that the optical black section 13 is shielded by the light shielding layer 19 that is made of aluminum. Because of this light shielding arrangement, incidence light illuminates only the photo diodes 16 of the light-receiving section 12.

The drain 14 is comprised of an N-type semiconductor layer 20 having a reverse bias applied thereto (i.e., positive potential applied thereto) where the N-type semiconductor layer 20 is formed deeper into the substrate than the P-type wells 15 and 17.

Figure 3:
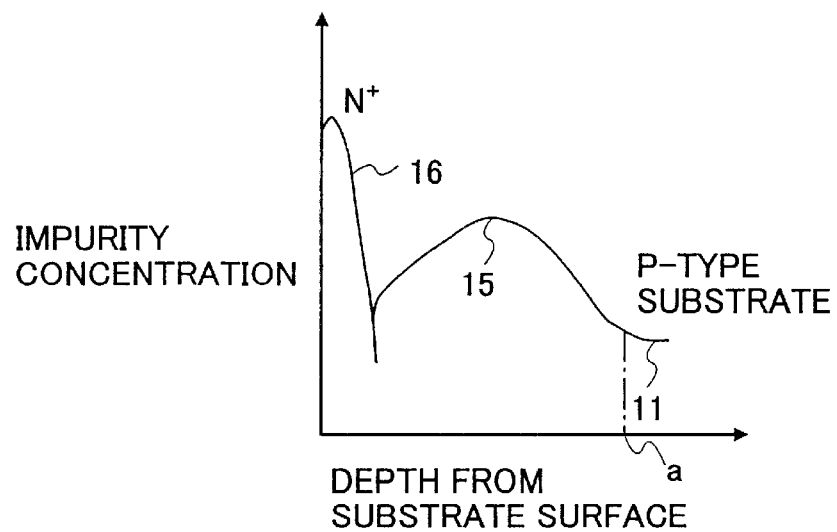
FIG. 3 is a drawing showing the impurity concentration of a photo diode section taken along a line 21–21' in the CMOS-type solid state imaging device of FIG. 2.
Figure 4:
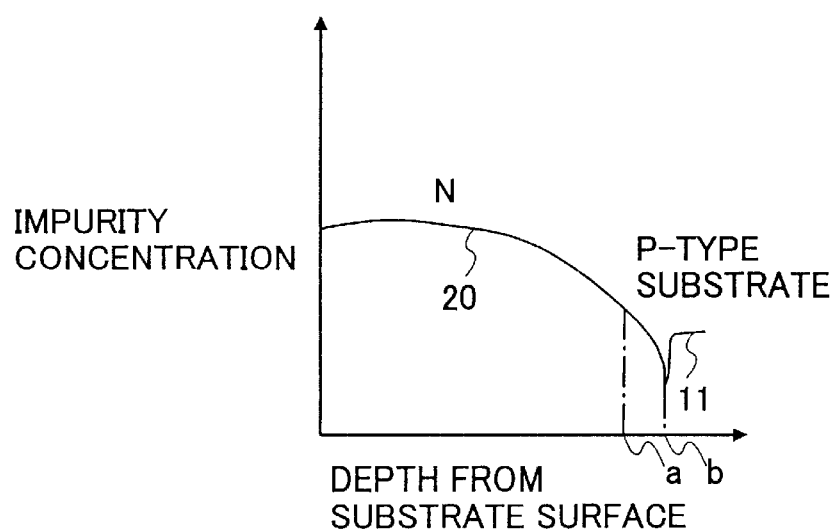
FIG. 4 is a drawing showing the impurity concentration of a drain section taken along a line 22–22' in the CMOS-type solid state imaging device of FIG. 2.

FIG. 3 is a drawing showing the impurity concentration of the photo diode section taken along a line 21–21' in the CMOS-type solid state imaging device of FIG. 2. FIG. 4 is a drawing showing the impurity concentration of the drain section taken along a line 22–22' in the CMOS-type solid state imaging device of FIG. 2.

In the photo diode section shown in FIG. 3, the photo diodes 16 that are of an N-type layer are formed in the surface of the substrate, followed by the formation of the P-type well 15 that has the impurity concentration thereof gradually increasing toward the core of the substrate. The P-type well 15 has the peak of concentration at a depth of 1 to 1.5 micrometers from the surface of the substrate.

In the drain section shown in FIG. 4, further, the N-type semiconductor layer 20 formed from the substrate surface reaches a position deeper in the substrate than the P-type well 15 shown in FIG. 3. That is, a depth b of the N type semiconductor layer 20 from the substrate surface is situated deeper in the substrate that the depth a from the substrate surface of the P-type well 15.

In the first embodiment of the CMOS type solid state imaging device according to the present invention described above, the light-receiving section 12 and the optical black section 13 are formed in separate wells, and the drain 14 is formed between the light-receiving section 12 and the optical black section 13. Through the function of the drain 14, it is possible to prevent electric charge leaking from the light-receiving section 12 from flowing into the optical black section 13 when intense light illuminates the light-receiving section 12.

That is, although electric charge generated in the P-type well 15 is accumulated at the photo diodes 16, the electric charge leaks out when the photo diodes 16 are saturated upon illumination by intense light. Even when this happens, the leaked charge will be captured by the drain 14. Moreover, since the N-type semiconductor layer 20 of the drain 14 is formed deeper into the substrate than the P-type well 15, electric charge generated at a depth deeper than the P-type well 15 will be captured by the drain 14 without flowing into the optical black section 13. Such prevention of inflow of electric charge is effective against the electric charge generated in the P-type well 15 as well as against the electric charge generated at a depth deeper than the P-type well 15, thereby making it possible to obtain a stable black level even when intense light illuminates the light-receiving section 12.

As a component of each pixel of the solid state imaging device, only a photo diode 16 is shown in FIG. 2, for example. In actuality, however, each pixel arranged in the light-receiving section 12 and the optical black 13 is comprised of an $N^+$-type photo diode 16 and a plurality of N-channel MOS transistors.

Figure 5:
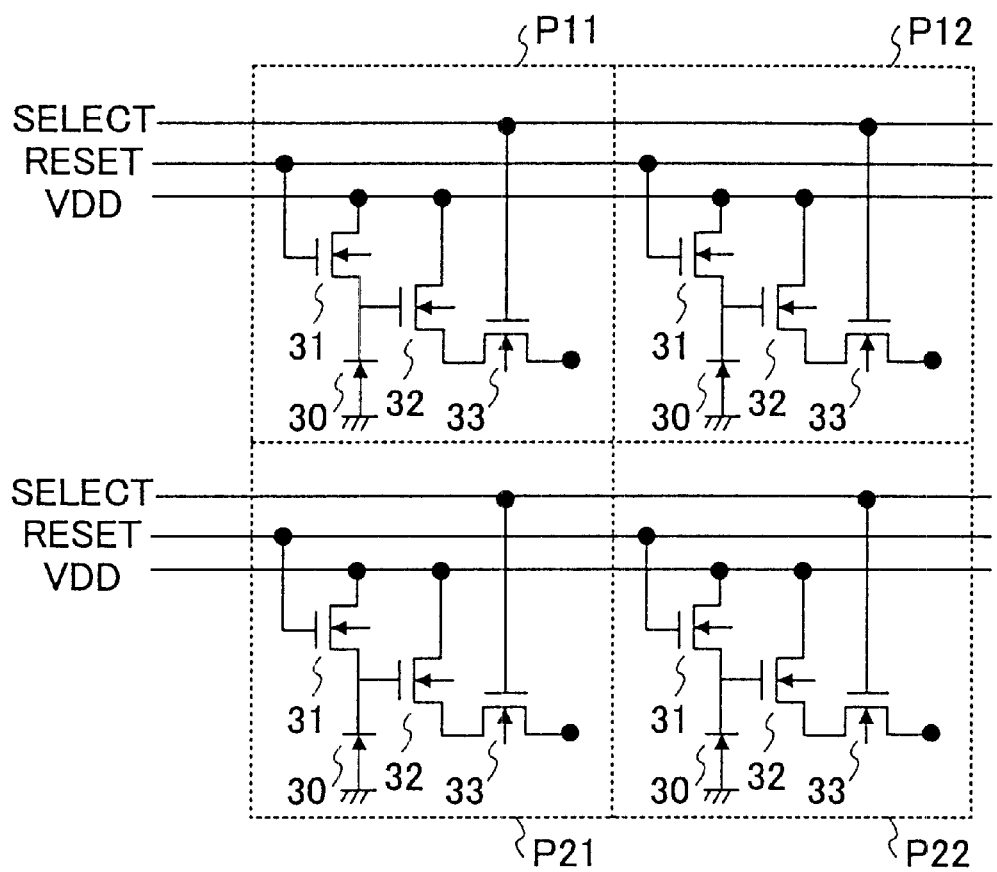
FIG. 5 is a circuit diagram showing a circuit configuration of each pixel of the solid state imaging device.

FIG. 5 is a circuit diagram showing a circuit configuration of each pixel of the solid state imaging device.

In the solid state imaging device, pixels are arranged in a matrix formation, for example. In FIG. 5, pixels P11, P12, P21, and P22 are arranged as an example of a 2-×-2 pixel array. Each pixel has the same configuration, and includes a photo diode 30 and NMOS transistors 31 through 33. The photo diode 30 corresponds to one of the photo diodes 16 or 18 shown in FIG. 2. The NMOS transistor 31 is a reset transistor which resets the photo diode 30 in response to a RESET signal, and the NMOS transistor 32 is a source-follower-type amplifier transistor which amplifies a signal accumulated at the photo diode 30. Further, the NMOS transistor 33 is a selection transistor which activates the amplifier transistor 32 in response to a SELECT signal. The signal accumulated at the photo diode 30 is read from one end of the selection transistor.

Figure 6:
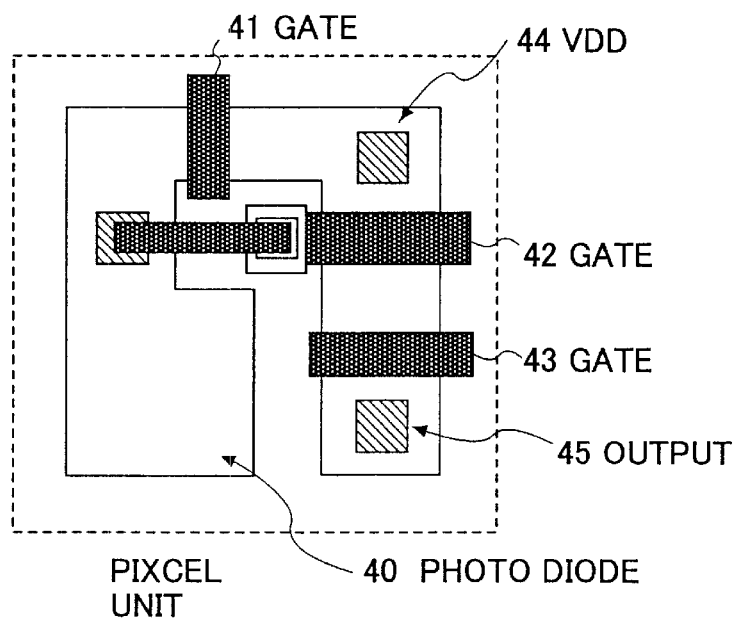
FIG. 6 is a plan view of a pixel of the solid state imaging device.

FIG. 6 is a plan view of a pixel of the solid state imaging device.

In the pixel of the solid state imaging device shown in FIG. 6, a photo diode 40 corresponds to the photo diode 30 of FIG. 5, and a gate 41 corresponds to the gate of the reset transistor 31 shown in FIG. 5. Further, a gate 42 corresponds to the gate of the amplifier transistor 32 of FIG. 5, and a gate 43 corresponds to the gate of the selection transistor 33 of FIG. 5. When the RESET signal is supplied to the gate 41, the photo diode 40 is reset by the power-supply potential VDD that is supplied to a terminal 44. The signal accumulated at the photo diode 40 is supplied to the gate 42, and is amplified. The amplified signal is output from the output terminal 45 when the SELECT signal is supplied to the gate 43.

Figure 7:
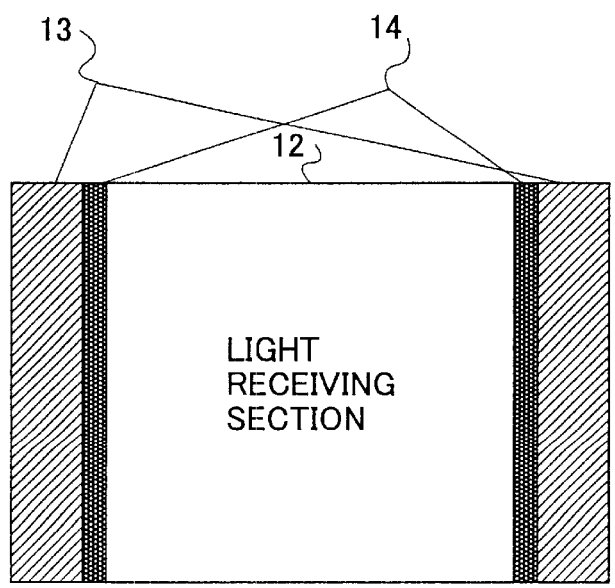
FIG. 7 is a plan view of a light-receiving section, an optical black section, and the drain portion of the CMOS-type solid state imaging device shown in FIG. 2.

FIG. 7 is a plan view of the light-receiving section, the optical black section, and the drain portion of the CMOS-type solid state imaging device shown in FIG. 2. In a configuration of FIG. 7, the optical black section 13 is provided on both sides of the light-receiving section 12. This configuration is used in order to read a black level during a current mirror drive operation at the same timing as in a normal drive operation.

Figure 8:
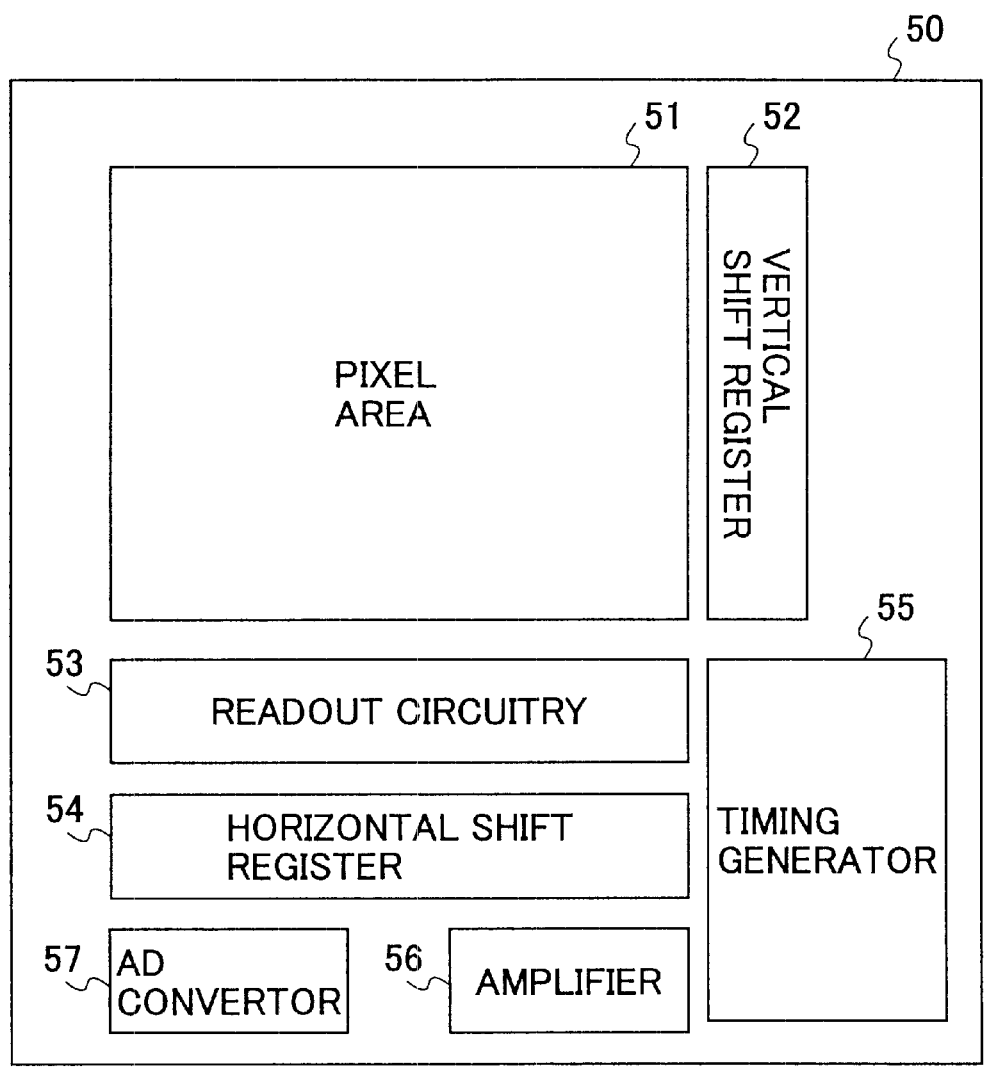
FIG. 8 is a block diagram showing an entire configuration of the solid state imaging device.

FIG. 8 is a block diagram showing an entire configuration of the solid state imaging device.

A solid state imaging device 50 of FIG. 8 includes a pixel area 51, a vertical shift register 52, a readout circuitry 53, a horizontal shift register 54, a timing generator 55, an amplifier 56, and an AD converter 57.

The pixel area 51 includes the light-receiving section 12, the optical black section 13, and the drain 14 as shown in FIG. 2 and FIG. 7, and is provided with pixels arranged in a matrix formation as shown in FIG. 5. The vertical shift register 52 drives the SELECT signals shown in FIG. 5 one after another in response to the timing signal generated by the timing generator 55, thereby successively selecting horizontal lines of the pixel matrix of the pixel area 51 one after another. Pixel signals of the selected horizontal line are retrieved to the horizontal shift register 54 through the readout circuitry 53. The pixel signals stored in the horizontal shift register 54 are sent out one after another as a time series signal according to the timing of the timing signal that is generated by the timing generator 55. The signals sent out one after another are amplified by the amplifier 56, and are further converted into digital signals by the AD converter 57.

Figure 9:
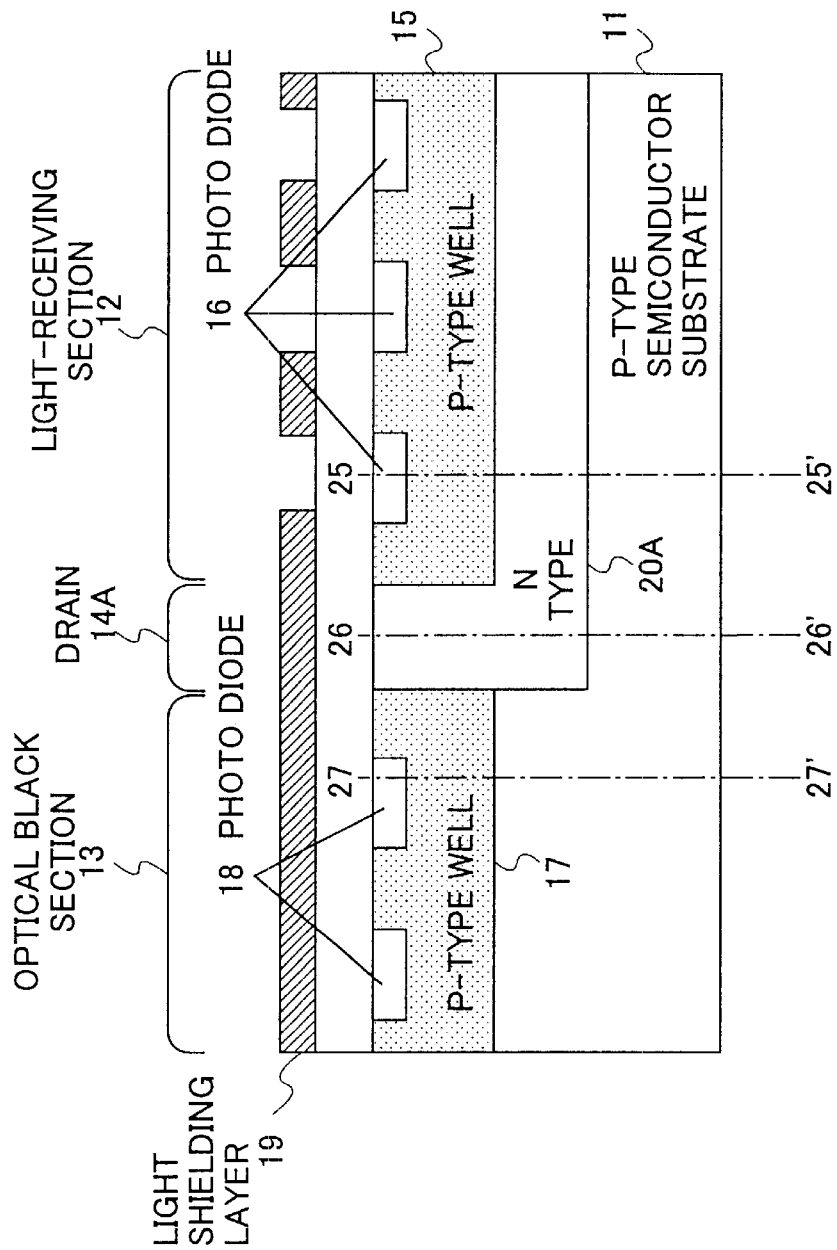
FIG. 9 is a drawing showing a configuration of a second embodiment of the CMOS-type solid state imaging device according to the present invention.

FIG. 9 is a drawing showing a configuration of a second embodiment of the CMOS-type solid state imaging device according to the present invention. In FIG. 9, the same elements as those of FIG. 2 are referred to by the same numerals.

In the CMOS-type solid state imaging device of FIG. 9, the light-receiving section 12, the optical black section 13, and a drain 14A are provided on the P-type-semiconductor substrate 11. The light-receiving section 12 includes the P-type well 15 that has the peak of impurity concentration in the core of the substrate, the photo diodes 16 made of an N-type semiconductor layer, and a plurality of MOS transistors (not shown). The optical black section 13 has the same structure as the light-receiving section 12, and includes the P-type well 17, the photo diodes 18 made of an N-type semiconductor layer, and a plurality of MOS transistors (not shown). The drain 14A is comprised of an N-type semiconductor layer 20A having a reverse bias applied thereto (i.e., positive potential applied thereto) where the N-type semiconductor layer 20A is formed so as to reach deeper into the substrate than the P-type wells 15 and 17 and to enclose the P-type well 15.

Figure 10:
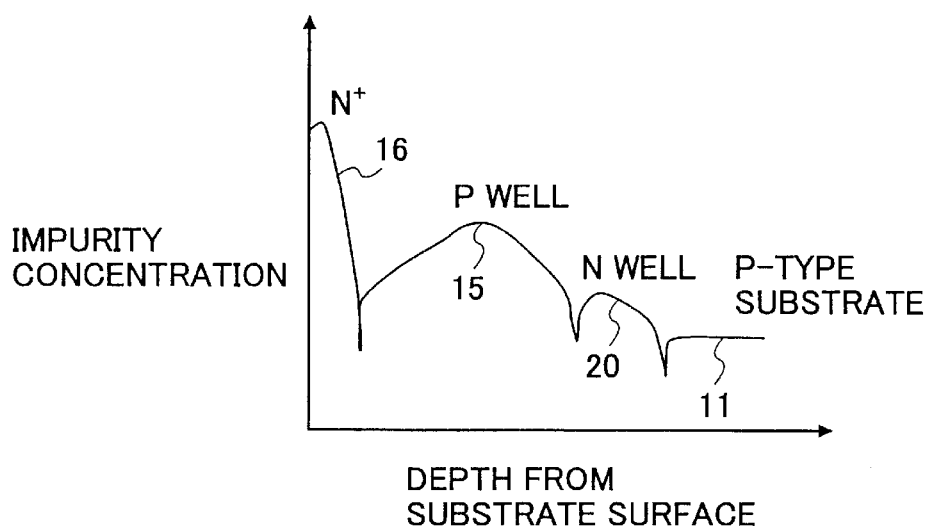
FIG. 10 is a drawing showing the impurity concentration of a photo diode section of a light-receiving section taken along a line 25–25' in the CMOS-type solid state imaging device shown in FIG. 9.
Figure 11:
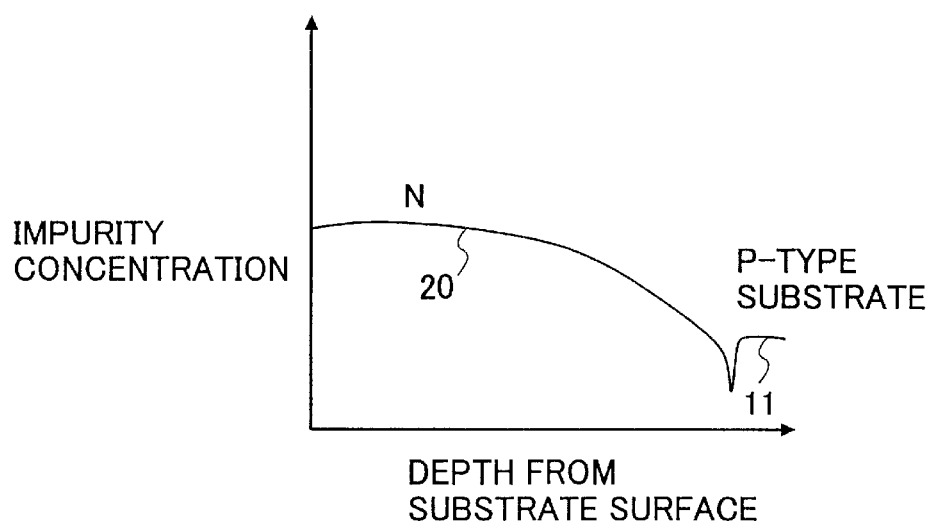
FIG. 11 is a drawing showing the impurity concentration of a drain section taken along a line 26–26' in the CMOS-type solid state imaging device of FIG. 9.

FIG. 10 is a drawing showing the impurity concentration of the photo diode section of the light-receiving section taken along a line 25–25' in the CMOS-type solid state imaging device shown in FIG. 9. FIG. 11 is a drawing showing the impurity concentration of the drain section taken along a line 26–26' in the CMOS-type solid state imaging device of FIG. 9. Further, FIG. 12 is a drawing showing the impurity concentration of the photo diode section of the optical black taken along a line 27–27' in the CMOS-type solid state imaging device of FIG. 9.

In the photo diode section of the light-receiving section shown in FIG. 10, the photo diodes 16 that are of an N-type layer are formed in the surface of the substrate, followed by the formation of the P-type well 15 that has the impurity concentration thereof gradually increasing toward the core of the substrate. The P-type well 15 has the peak of concentration at a depth of 1 to 1.5 micrometers from the surface of the substrate. At a depth farther away from the substrate surface, the N-type semiconductor layer 20 of the drain 14A exists, separating the P-type well 15 from the P-type-semiconductor substrate 11.

In the drain section shown in FIG. 11, the N-type semiconductor layer 20 extending from the substrate surface reaches a position deeper in the substrate than the P-type well 15 shown in FIG. 15.

Figure 12:
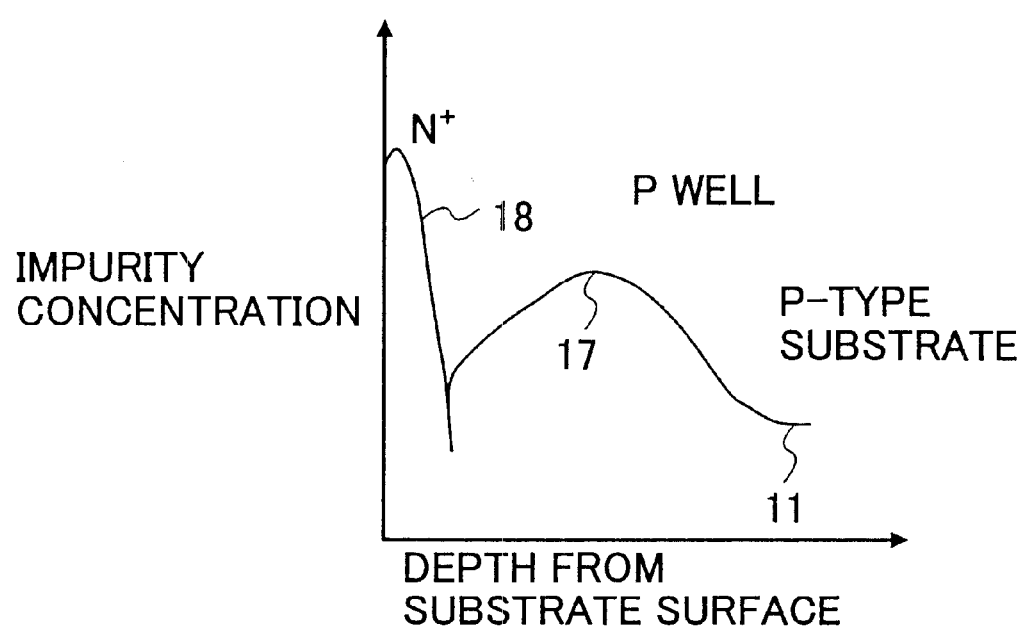
FIG. 12 is a drawing showing the impurity concentration of a photo diode section of an optical black taken along a line 27–27' in the CMOS-type solid state imaging device of FIG. 9.

Moreover, in the photo diode section of the optical black shown in FIG. 12, the photo diodes 18 that are of an N-type layer are formed in the surface of the substrate, followed by the formation of the P-type well 17 that has the impurity concentration thereof gradually increasing toward the core of the substrate. The P-type well 17 has the peak of concentration at a depth of 1 to 1.5 micrometers from the surface of the substrate.

As described above, the light-receiving section 12 and the optical black section 13 are formed in separate wells, and the drain 14A is provided between the light-receiving section 12 and the optical black section 13 such that the drain 14A goes under the light-receiving section 12 to enclose the same. The function of the drain 14A makes it possible to completely confine the electric charge that would possibly go under the drain 14 and leak from the light-receiving section 12 to the optical black section 13 in the configuration of the first embodiment. Therefore, it is possible to obtain a stable black level even when intense light illuminates the light-receiving section 12.

Figure 13:
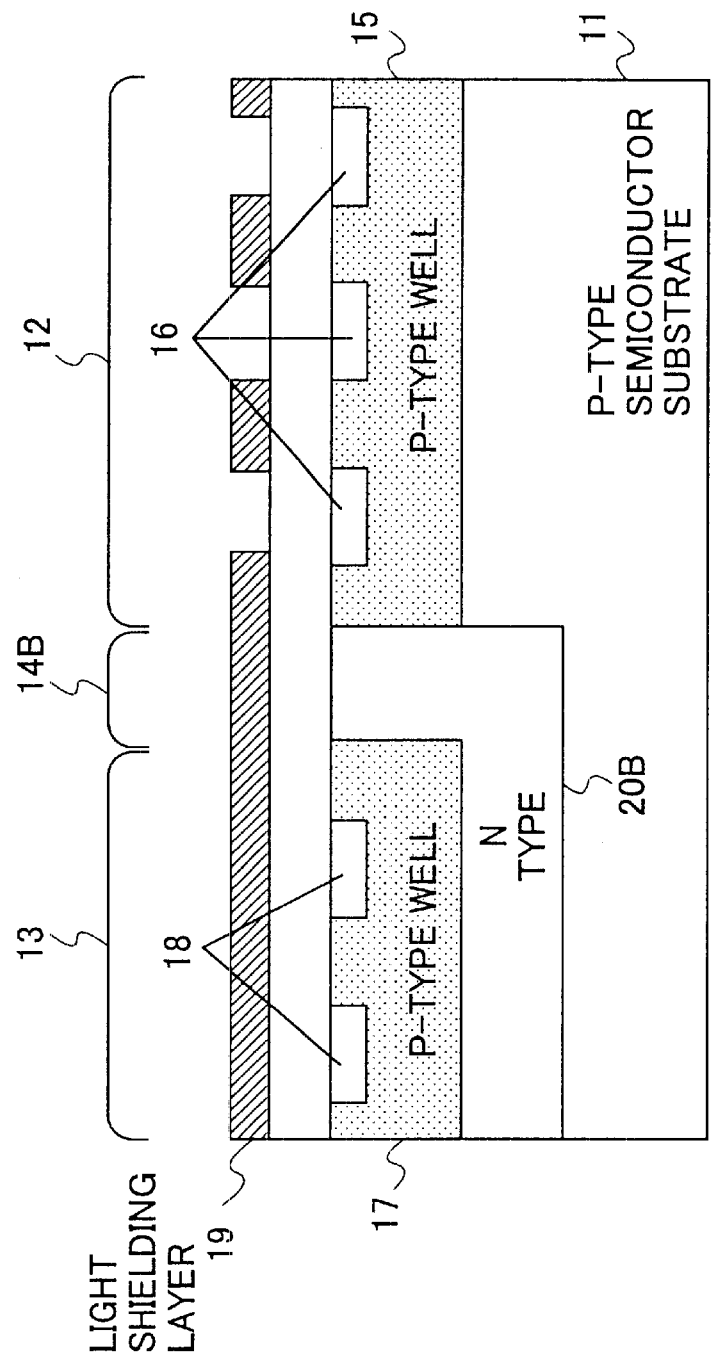
FIG. 13 is a drawing showing a configuration of a third embodiment of the CMOS-type solid state imaging device according to the present invention.

FIG. 13 is a drawing showing a configuration of a third embodiment of the CMOS-type solid state imaging device according to the present invention. In FIG. 13, the same elements as those of FIG. 2 are referred to by the same numerals.

In the CMOS-type solid state imaging device of FIG. 13, the light-receiving section 12, the optical black section 13, and a drain 14B are provided on the P-type-semiconductor substrate 11. The light-receiving section 12 includes the P-type wells 15 having the peak of impurity concentration in the core of the substrate, the photo diodes 16 made of an N-type semiconductor layer, and a plurality of MOS transistors (not shown). The optical black section 13 has the same structure as the light-receiving section 12, and includes the P-type well 17, the photo diodes 18 made of an N-type semiconductor layer, and a plurality of MOS transistors (not shown). The drain 14B is comprised of an N-type semiconductor layer 20B having a reverse bias applied thereto where the N-type semiconductor layer 20B is formed so as to reach a depth deeper in the substrate than the P-type wells 15 and 17 and to enclose the P-type well 17.

In the third embodiment of the CMOS-type solid state imaging device according to the present invention, the function of the drain 14B can completely shut out the electric charge that would possibly go under the drain 14 and leak from the light-receiving section 12 to the optical black section 13 in the configuration of the first embodiment. Therefore, it is possible to obtain a stable black level even when intense light illuminates the light-receiving section 12.

Figure 14:
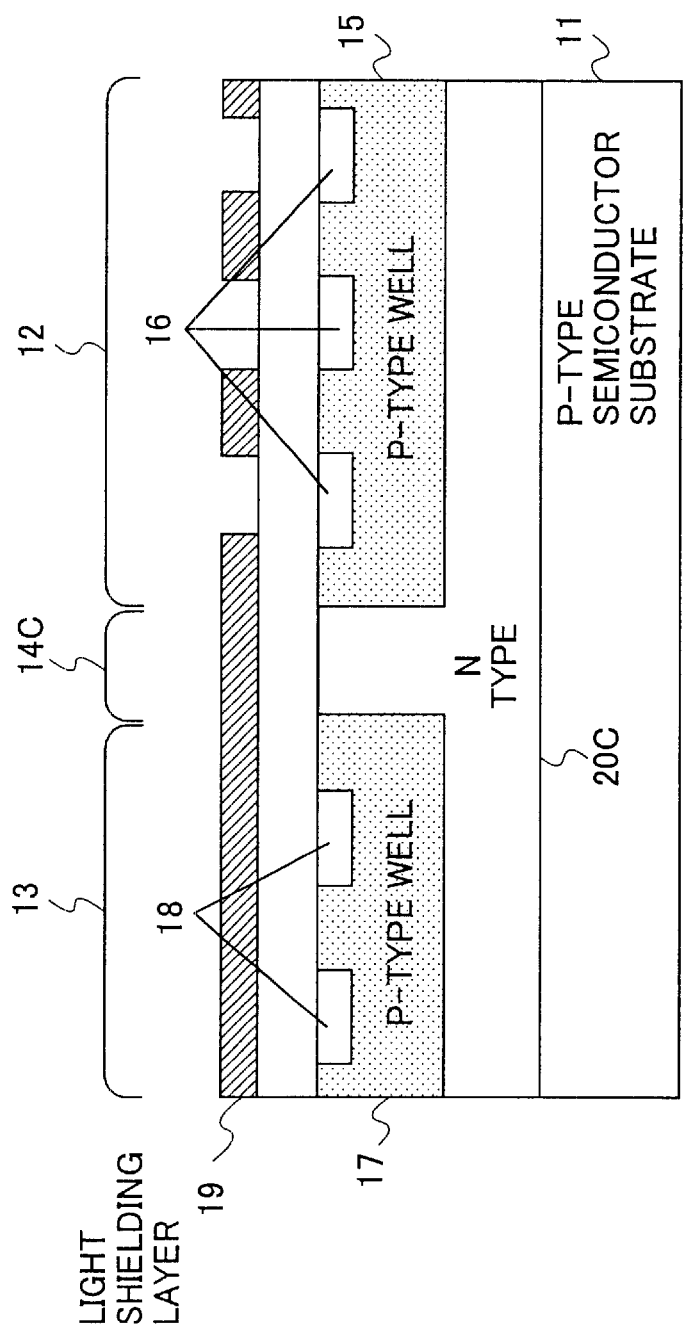
FIG. 14 is a drawing showing a configuration of a fourth embodiment of the CMOS-type solid state imaging device according to the present invention.

FIG. 14 is a drawing showing a configuration of the fourth embodiment of the CMOS-type solid state imaging device according to the present invention. In FIG. 14, the same elements as those of FIG. 2 are referred to by the same numerals.

In the CMOS-type solid state imaging device of FIG. 14, the light-receiving section 12, the optical black section 13, and a drain 14C are provided on the P-type-semiconductor substrate 11. The drain 14C is comprised of an N-type semiconductor layer 20C having a reverse bias applied thereto where the N-type semiconductor layer 20C is formed so as to reach a depth deeper in the substrate than the P-type wells 15 and 17 and to enclose the P-type wells 15 and 17.

In the fourth embodiment of the CMOS-type solid state imaging device according to the present invention, the function of the drain 14C can completely shut out the electric charge that would possibly go under the drain 14 and leak from the light-receiving section 12 to the optical black section 13 in the configuration of the first embodiment. Therefore, it is possible to obtain a stable black level even when intense light illuminates the light-receiving section 12.

Although the CMOS-type solid state imaging device of a photo-diode type has been described in the above embodiments, the present invention is applicable to a CMOS-type solid state imaging device of a photo-gate type that accumulates electric charge in potential wells formed by electrodes. Moreover, although the pixel configuration has been shown as a two-dimensional array in the above embodiments, the pixel configuration may as well be a one-dimensional array.

Moreover, it is also possible to form a semiconductor layer by epitaxial growth or the like on a semiconductor substrate, followed by forming the light-receiving section, the light-shielding section, and the drain on the surface of this semiconductor layer.

Further, the present invention is not limited to these embodiments, but various variations and modifications. may be made without departing from the scope of the present invention.

The present application is based on Japanese priority application no. 2001-130216 filed on Apr. 26, 2001, with the japanese patent office, the entire contents of which are hereby incorporated by reference.

What is claimed is:

1. A solid state imaging device, comprising:

a semiconductor substrate;

a light receiving section which is provided in a surface of said semiconductor substrate, and includes an array of pixels that accumulate electric charge through photoelectric conversion of incoming light;

a light shielding section which includes an array of pixels formed in the surface of said semiconductor substrate and shielded from light; and a drain which is situated between said light receiving section and said light shielding section, and is formed to a depth deeper in said semiconductor substrate than said light receiving section and said light shielding section.

2. The solid state imaging device as claimed in claim 1, wherein said drain extends under said light receiving section so as to enclose said light receiving section.

3. The solid state imaging device as claimed in claim 1, wherein said drain extends under said light shielding section so as to enclose said light shielding section.

4. The solid state imaging device as claimed in claim 1, wherein said drain extends under said light receiving section and said light shielding section so as to enclose said light receiving section and said light shielding section.

5. The solid state imaging device as claimed in claim 1, wherein said semiconductor substrate is a P-type semiconductor substrate, and said drain is of an N-type semiconductor layer having a reverse bias applied thereto.

6. The solid state imaging device as claimed in claim 5, wherein said light receiving section and said light shielding section are formed in a P-type semiconductor layer.

7. The solid state imaging device as claimed in claim 6, wherein each of the pixels includes:

a charge accumulation portion for accumulating electric charge; and a plurality of NMOS transistors.

8. A solid state imaging device, comprising:

a semiconductor substrate;

a semiconductor layer formed on said semiconductor substrate;

a light receiving section which is formed in a surface of said semiconductor layer, and includes an array of pixels that accumulate electric charge through photoelectric conversion of incoming light;

a light shielding section which includes an array of pixels formed in the surface of said semiconductor layer and shielded from light; and a drain which is situated between said light receiving section and said light shielding section, and is formed to a depth deeper in said semiconductor substrate than said light receiving section and said light shielding section.

* * * * *